United States Patent
Sugimori

(10) Patent No.: US 8,253,143 B2
(45) Date of Patent: Aug. 28, 2012

(54) LIGHT EMITTING MODULE AND METHOD OF MANUFACTURING THE SAME

(75) Inventor: Shogo Sugimori, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 134 days.

(21) Appl. No.: 12/796,010

(22) Filed: Jun. 8, 2010

(65) Prior Publication Data

US 2010/0314650 A1 Dec. 16, 2010

(30) Foreign Application Priority Data

Jun. 10, 2009 (JP) .................................. 2009-139563

(51) Int. Cl.
*H01L 27/14* (2006.01)
(52) U.S. Cl. .................... 257/72; 257/89; 257/E27.118; 257/E25.004; 438/35; 438/956
(58) Field of Classification Search .................. None
See application file for complete search history.

(56) References Cited

U.S. PATENT DOCUMENTS

| 2004/0058476 A1* | 3/2004 | Enquist et al. ................. 438/114 |
| 2008/0023719 A1* | 1/2008 | Camras et al. .................. 257/98 |

FOREIGN PATENT DOCUMENTS

JP 2007-59864 A 3/2007

* cited by examiner

*Primary Examiner* — Benjamin Sandvik
*Assistant Examiner* — Scott R Wilson
(74) *Attorney, Agent, or Firm* — Sughrue Mion, PLLC

(57) ABSTRACT

There is provided a light emitting module. The light emitting module includes: a semiconductor light emitting element that emits light; and a plate-like optical wavelength conversion member that converts a wavelength of light emitted from the semiconductor light emitting element and emits light having the converted wavelength. The semiconductor light emitting element and the optical wavelength conversion member are directly bonded to each other.

17 Claims, 4 Drawing Sheets

LIGHT EMITTING MODULE AND METHOD OF MANUFACTURING THE SAME

CROSS-REFERENCE TO RELATED APPLICATION

This application claims priority from Japanese Patent Application No. 2009-139563, filed on Jun. 10, 2009, the entire contents of which are hereby incorporated by reference.

BACKGROUND

1. Technical Field

The present disclosure relates to a light emitting module and a method of manufacturing the light emitting module.

2. Related Art

In the past, there has been known a technique that achieves a light emitting module using a fluorescent material. The light emitting module converts the wavelength of light emitted from a LED (Light Emitting Diode) and emits light whose color is different from the color of the light emitted from the LED (see e.g., JP-A-2007-59864). Meanwhile, there has been proposed a technique in which a ceramic layer, which contains a wavelength conversion member, is provided on the path of light emitted from a light emitting layer in order to increase conversion efficiency, for example (see e.g., JP-A-2007-59864).

In order to efficiently convert the wavelength of light, which is emitted from the LED, using the ceramic layer described in JP-A-2007-59864, a ceramic layer needs to be mounted on a light emitting surface of the LED. In connection with this, there is considered, for example, a method of bonding the ceramic layer to the LED using an adhesive, such as a silicon adhesive. Meanwhile, in recent years, there has been a strong demand for an increase in the light output of the LED or the shortening the wavelength of the LED. Accordingly, the bonding between the ceramic layer and the LED has also been required to address these demands. However, as the light output of the LED is increased or the wavelength of the LED is shortened, the adhesive tends to degrade. For this reason, it is not easy to obtain sufficient reliability of the bonding between the ceramic layer and the LED when an adhesive layer is used. Further, the refractive index of this adhesive is generally low and there is a possibility that voids are formed on the adhesive surface. Thus, if an adhesive is used to bond the ceramic layer and the LED, there is a concern that the extraction efficiency of light emitted from the LED is lowered.

SUMMARY

Exemplary embodiments of the present invention may address the above disadvantages and other disadvantages not described above. However, the present invention is not required to overcome the disadvantages described above, and thus, an exemplary embodiment of the present invention may not overcome any disadvantages.

Accordingly, one illustrative aspect of an exemplary embodiment of the present invention is to appropriately bond a light emitting element to an optical wavelength conversion member that converts the wavelength of light emitted from the light emitting element, without adhesive.

According to one or more other illustrative aspects of an exemplary embodiment of the present invention, there is provided a method of manufacturing a light emitting module. The method may include: directly bonding a semiconductor light emitting element to a plate-like optical wavelength conversion member, which converts a wavelength of light emitted from the semiconductor light emitting element and emits a light having the converted wavelength, without adhesive.

Other aspects and advantages of the present invention will be apparent from the following description, the drawings and the claims.

DETAILED DESCRIPTION OF EXEMPLARY EMBODIMENTS

According to one or more illustrative aspects of an exemplary embodiment of the invention, there is provided a light emitting module that includes: a semiconductor light emitting element that emits light; and a plate-like optical wavelength conversion member that converts a wavelength of light emitted from the semiconductor light emitting element and emits light having the converted wavelength. The semiconductor light emitting element and the optical wavelength conversion member are directly bonded to each other without adhesive.

According to the above aspect of the invention, for example, even when the light output of the semiconductor light emitting element is increased or the wavelength of the semiconductor light emitting element is shortened, it may be possible to avoid degradation of bonding portion between the semiconductor light emitting element and the optical wavelength conversion member. Accordingly, it may be possible to suppress the deterioration of reliability of the bonding between the semiconductor light emitting element and the optical wavelength conversion member.

The semiconductor light emitting element may include a semiconductor layer, and the semiconductor layer and the optical wavelength conversion member may be directly bonded to each other without adhesive.

The semiconductor light emitting element may include: a semiconductor layer; and a crystal growth substrate that is used for a crystal growth of the semiconductor layer. The crystal growth substrate and the optical wavelength conversion member may be directly bonded to each other without adhesive.

The semiconductor light emitting element may include a bonding buffer layer, and the bonding buffer layer and the optical wavelength conversion member may be directly bonded to each other without adhesive.

The optical wavelength conversion member may include a bonding buffer layer, and the bonding buffer layer and the semiconductor light emitting element may be directly bonded to each other without adhesive.

The bonding buffer layer and the semiconductor light emitting element may be directly bonded to each other by surface activation bonding.

The bonding buffer layer and the semiconductor light emitting element may be directly bonded to each other by plasma bonding.

Exemplary embodiments of the invention will be now described in detail with reference to drawings.

(First Embodiment)

Figure 1:
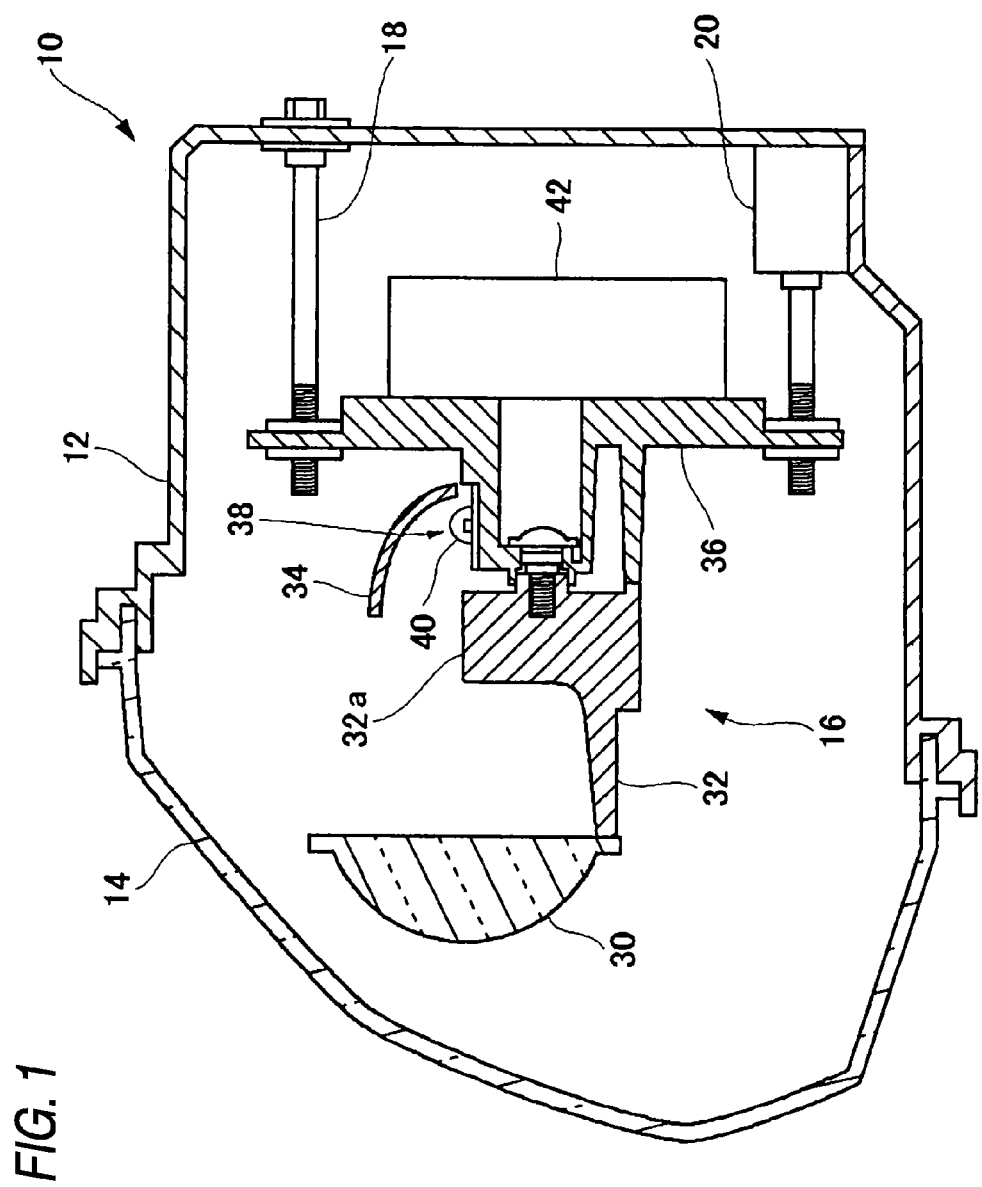
FIG. 1 is a cross-sectional view showing a vehicle headlamp according to a first embodiment of the invention.

FIG. 1 is a cross-sectional view showing the structure of a vehicle headlamp 10 according to a first embodiment of the invention. The vehicle headlamp 10 includes a lamp body 12, a front cover 14, and a lamp unit 16. Hereinafter, the left side in FIG. 1 will be described as the front side of a lamp and the right side in FIG. 1 will be described as the rear side of the lamp. Further, when seen from the front side of the lamp, the right side is referred to as the right side of the lamp and the left side is referred to as the left side of the lamp. FIG. 1 shows a cross-section of the vehicle headlamp 10 taken along a vertical plane, which includes an optical axis of the lamp unit 16, when seen from the left side of the lamp. Meanwhile, the vehicle headlamps 10 are bilaterally mounted on front left and front right portions of the vehicle, respectively. FIG. 1 shows a schematic view of one of the left or right vehicle headlamps 10.

The lamp body 12 is formed in a box shape having an opening. The front cover 14 is made of a translucent resin or glass and formed in the shape of a bowl. An edge portion of the front cover 14 is mounted on the opening of the lamp body 12. In this way, a lamp chamber is formed by the lamp body 12 and the front cover 14.

A lamp unit 16 is disposed in the lamp chamber. The lamp unit 16 is fixed to the lamp body 12 by aiming screws 18. The lower aiming screw 18 is configured to rotate as a leveling actuator 20 operates. For this reason, it may be possible to move an optical axis of the lamp unit 16 in a vertical direction by operating the leveling actuator 20.

The lamp unit 16 includes a projection lens 30, a support member 32, a reflector 34, a bracket 36, a light emitting module substrate 38, and a heat radiating fin 42. The projection lens 30 is a plano-convex aspheric lens in which the surface corresponding to the front side of the lamp is a convex surface and the surface corresponding to the rear side of the lamp is a flat surface. The projection lens projects a light source image, which is formed on a rear focal plane thereof, to the front side of the lamp as an inverted image. The support member 32 supports the projection lens 30. The light emitting module substrate 38 is provided with a light emitting module 40. The reflector 34 reflects light, which is emitted from the light emitting module 40, and forms a light source image on the rear focal plane of the projection lens 30. As described above, the reflector 34 and the projection lens 30 function as optical members that focus light emitted from the light emitting module 40 to the front side of the lamp. The heat radiating fin 42 is mounted on the rear surface of the bracket 36, and mainly radiates heat that is emitted from the light emitting module 40.

A shade 32a is formed at the support member 32. The vehicle headlamp 10 is used as a low beam light source. The shade 32a forms a cutoff line of a low beam light distribution pattern on the front side of a vehicle by blocking a part of light that is emitted from the light emitting module 40 and reflected by the reflector 34. Since the low beam light distribution pattern has been well known, the description thereof will be omitted herein.

Figure 2:
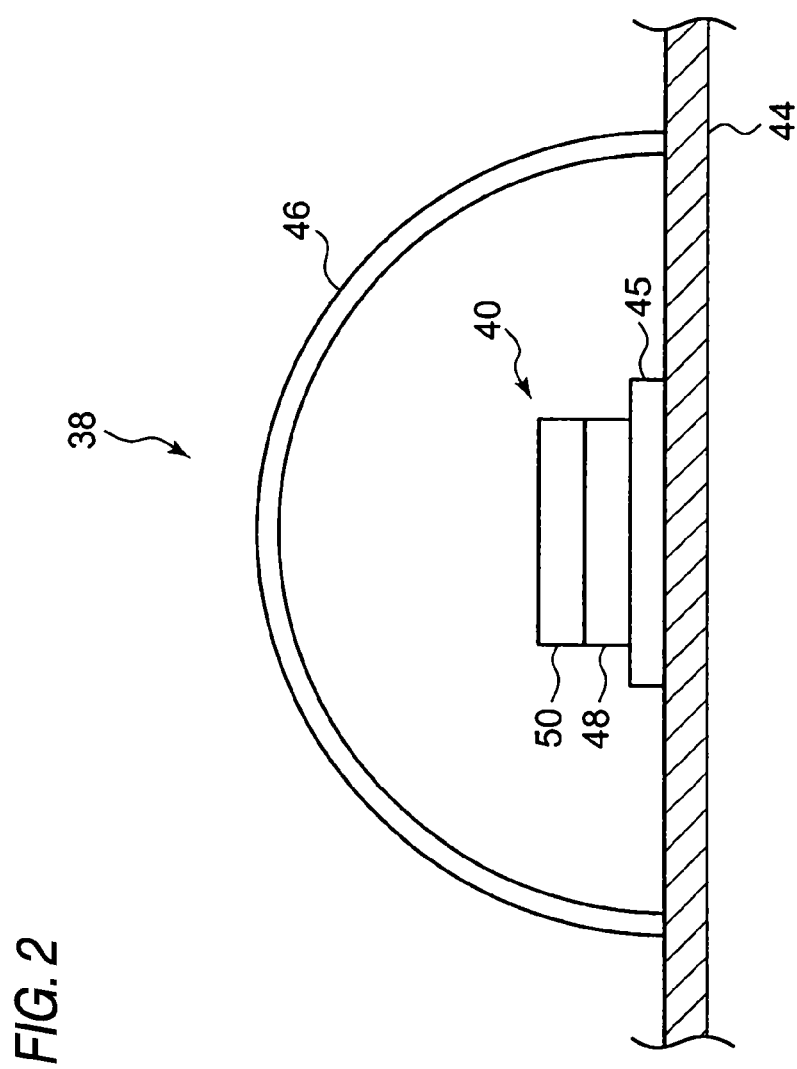
FIG. 2 is a view showing a light emitting module substrate according to the first embodiment of the invention.

FIG. 2 is a schematic view showing the light emitting module substrate 38 according to the first embodiment. The light emitting module substrate 38 includes the light emitting module 40, a substrate 44, a submount 45, and a transparent cover 46. The light emitting module 40 is mounted on the submount 45, the submount 45 is mounted on the substrate 44, the light emitting module 40 is covered with a colorless transparent cover 46, and the transparent cover 46 has a hollow therein. The light emitting module 40 includes a semiconductor light emitting element 48 and an optical wavelength conversion member 50.

Figure 3:
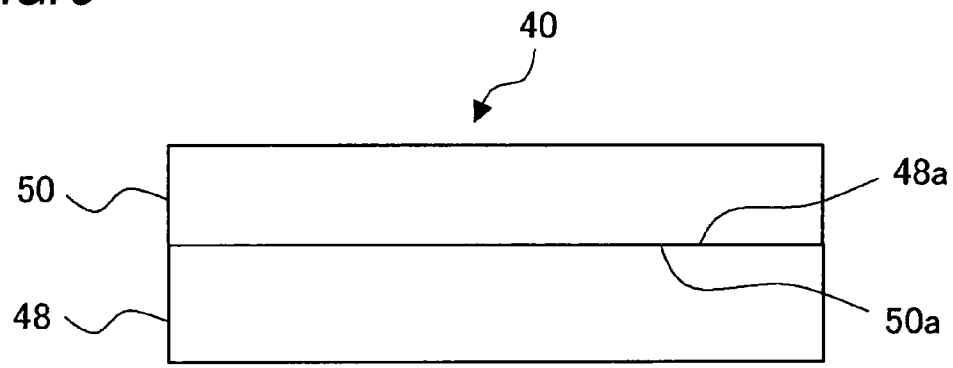
FIG. 3 is a side view of a light emitting module according to the first embodiment of the invention.

FIG. 3 is a side view of the light emitting module 40 according to the first embodiment. The semiconductor light emitting element 48 is formed of a LED element. A blue LED, which mainly emits blue-wavelength light, is employed as the semiconductor light emitting element 48 in the first embodiment. Specifically, the semiconductor light emitting element 48 is formed of a nitride-based LED element that is formed by growing the crystal of an $Al_xIn_yGa(1-x-y)N$ ($0 \leq x$, $y \leq 1$) semiconductor layer. However, a material of the semiconductor light emitting element 48 is not limited to a nitride-based material. For example, other materials such as ZnO may be employed as the material of the semiconductor light emitting element.

The semiconductor light emitting element 48 is formed of a chip having a size of, for example, about 1 mm square, and is formed such that the center wavelength of emitted blue light is about 460 nm. Meanwhile, the structure of the semiconductor light emitting element 48 and the wavelength of light emitted from the semiconductor light emitting element are not limited to the above-mentioned structure and wavelength. A semiconductor light emitting element 48, which mainly emits light except for blue-wavelength light, may be employed as the semiconductor light emitting element 48.

A so-called flip-chip element is employed as the semiconductor light emitting element 48. Meanwhile, other elements may be employed as the semiconductor light emitting element 48. For example, a so-called vertical-chip element or a so-called face-up element may be employed as the semiconductor light emitting element 48.

The optical wavelength conversion member 50 is a so-called light emitting ceramics or fluorescent ceramics, and may be obtained by sintering a ceramic base made of YAG (Yttrium Aluminum Garnet) powder that is a fluorescent material excited by blue light. Since a method of manufacturing an optical wavelength conversion ceramics is known, the detailed description thereof will be omitted herein. Further, the optical wavelength conversion member 50 is not limited to sinter ceramics, and may include, for example, an amorphous member, a polycrystalline member, and a single-crystalline member. The optical wavelength conversion member is not limited by the crystalline structure, and the like.

Further, a transparent member is employed as the optical wavelength conversion member 50. In the first embodiment, "transparent" means that the total light transmittance of light in a conversion wavelength range is 40% or more. As a result of the dedicated research and development of the inventor, it has been found that, in a transparent state where the total light transmittance of light in the conversion wavelength range is 40% or more, it may be possible to appropriately convert the wavelength of light in the optical wavelength conversion member 50 and to appropriately suppress the reduction of the intensity of light passing through the optical wavelength conversion member. Accordingly, it may be possible to more efficiently convert the light, which is emitted from the semiconductor light emitting element 48, in such the transparent state of the optical wavelength conversion member 50.

Furthermore, the optical wavelength conversion member 50 is made of an inorganic material, which does not contain an organic binder, and thus can improve the durability as compared to that of an optical wavelength conversion member that is made of an organic material such as an organic binder. For this reason, for example, electric power of 1 W (watt) or more may be applied to the light emitting module 40, so that it may be possible to increase the luminance, intensity, and flux of the light that is emitted from the light emitting module 40. Meanwhile, a binder may be contained in the optical wavelength conversion member 50.

The optical wavelength conversion member 50 converts the wavelength of blue light that is mainly emitted from the semiconductor light emitting element 48, and emits yellow light. For this reason, the light emitting module 40 emits white light, that is, combined light of blue light that is transmitted through the optical wavelength conversion member 50, and yellow light that is obtained by the wavelength conversion using the optical wavelength conversion member 50.

The semiconductor light emitting element 48 is formed by growing the crystal of a semiconductor layer on a crystal growth substrate (for example, sapphire substrate). In the first embodiment, the semiconductor light emitting element is formed by bonding a semiconductor layer of which the crystal has been grown to the optical wavelength conversion member 50 and removing the crystal growth substrate.

A light emitting surface 48a of the semiconductor light emitting element 48 and an incident plane 50a of the optical wavelength conversion member 50 are fixed to each other by direct bonding without adhesive. According to experimental results, it has been confirmed that the light emitting surface of the semiconductor light emitting element and the incident plane of the optical wavelength conversion member can be directly bonded to each other by surface activation bonding. Meanwhile, it has also been confirmed that the light emitting surface of the semiconductor light emitting element and the incident plane of the optical wavelength conversion member can be directly bonded to each other by plasma bonding. The semiconductor light emitting element 48 and the optical wavelength conversion member 50 are directly bonded to each other without using, for example, a silicon or organic adhesive as descried above, and thus it may be possible to prevent the degradation of a bonding portion and the deterioration of the extraction efficiency of light emitted from the semiconductor light emitting element 48.

(Second Embodiment)

Figure 4:
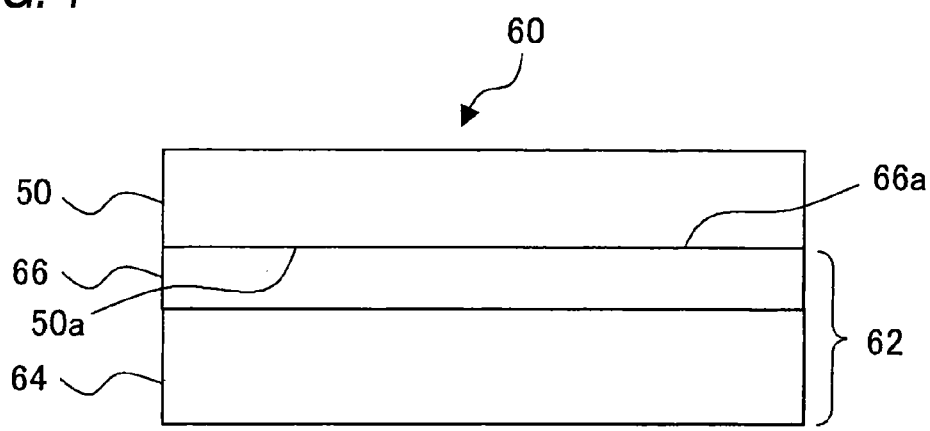
FIG. 4 is a side view of a light emitting module according to a second embodiment of the invention.

FIG. 4 is a side view of a light emitting module 60 according to a second embodiment of the invention. However, the configuration of a vehicle headlamp 10 according to the second embodiment is substantially the same as that according to the first embodiment except that a light emitting module 60 is provided instead of the light emitting module 40. Hereinafter, the same components as those of the first embodiment are denoted by the same reference numerals and the description thereof will be omitted herein.

The light emitting module 60 includes a semiconductor light emitting element 62 and an optical wavelength conversion member 50. In the second embodiment, the semiconductor light emitting element 62 includes a semiconductor layer 64 and a crystal growth substrate 66 that is used for the crystal growth of the semiconductor layer 64. The crystal growth substrate 66 is made of sapphire, for example. In the semiconductor light emitting element 62, the outer surfaces of the crystal growth substrate 66, which is opposite to the surface thereof contacting the semiconductor layer 64, serves as an emission surface 66a of light emitted from the semiconductor layer 64.

Since the semiconductor layer 64 is formed by growing the crystal on the crystal growth substrate 66, the semiconductor layer 64 and the crystal growth substrate 66 are fixed to each other. The semiconductor layer 64 is formed in the same manner as that of the semiconductor light emitting element 48 according to the first embodiment except that the crystal growth substrate 66 is not removed. Accordingly, the semiconductor light emitting element 62 is provided so as to mainly emit blue light, and a flip-chip element is employed as the semiconductor light emitting element.

In the second embodiment, the emission surface 66a of the crystal growth substrate 66 and the incident plane 50a of the optical wavelength conversion member 50 are directly bonded to each other. According to experimental results, it has been confirmed that the light emitting surface of the crystal growth substrate and the incident plane of the optical wavelength conversion member can be directly bonded to each other by both surface activation bonding and plasma bonding. Accordingly, even in this aspect, it may be possible to directly bond the semiconductor light emitting element 48 to the optical wavelength conversion member 50 without adhesive.

(Third Embodiment)

Figure 5:
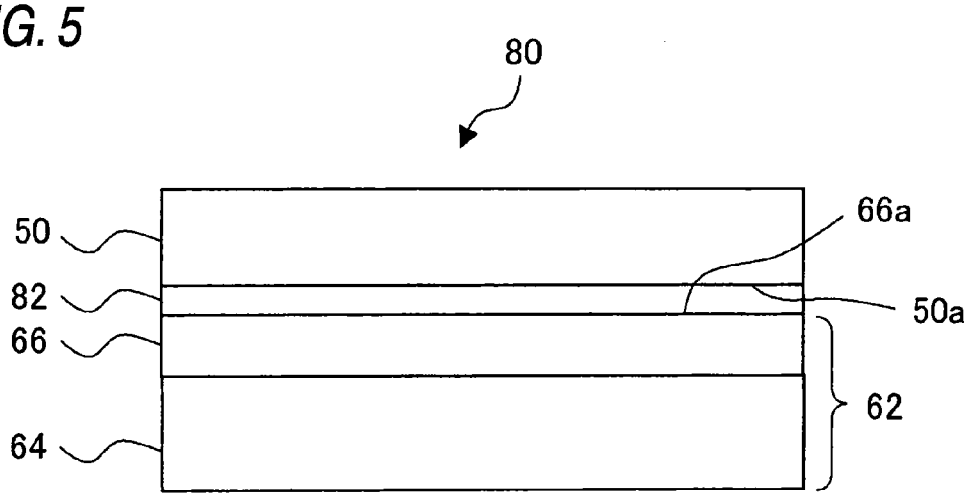
FIG. 5 is a side view of a light emitting module according to a third embodiment of the invention.

FIG. 5 is a side view of a light emitting module 80 according to a third embodiment of the invention. Meanwhile, the configuration of a vehicle headlamp 10 according to the third embodiment is substantially the same as that according to the first embodiment except that a light emitting module 80 is provided instead of the light emitting module 40. Hereinafter, the same components as those of the above-mentioned embodiment are denoted by the same reference numerals and the description thereof will be omitted herein.

The light emitting module 80 includes a semiconductor light emitting element 62, an optical wavelength conversion member 50, and a bonding buffer layer 82. The material of the bonding buffer layer 82 may be YAG or $SiO_2$, for example. The bonding buffer layer 82 is disposed between the emission surface 66a and the incident plane 50a.

Figure 6:
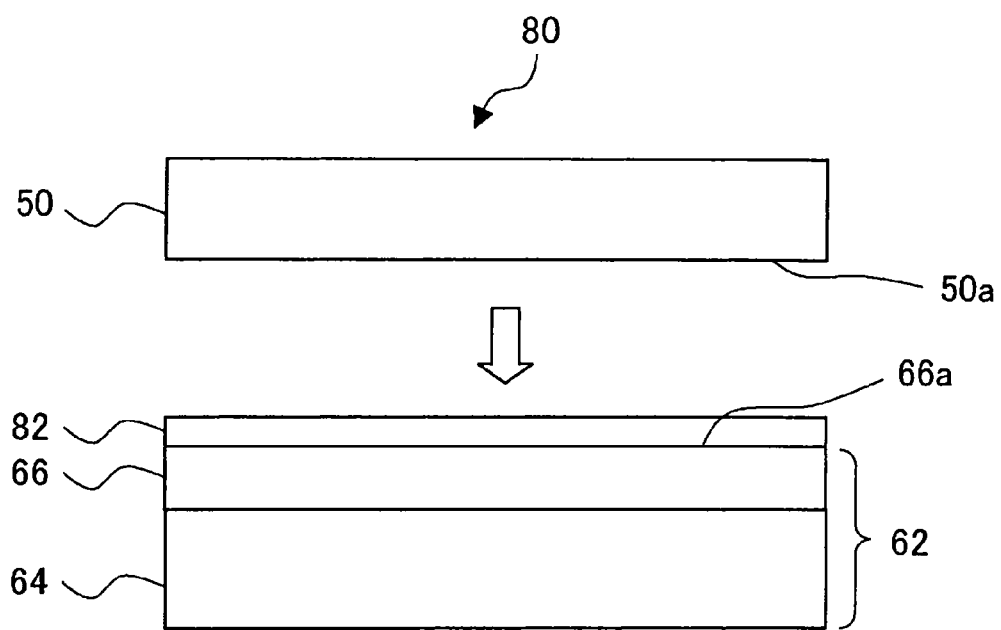
FIG. 6 is a view showing the light emitting module according to the third embodiment in a state before an optical wavelength conversion member and a semiconductor light emitting element are bonded to each other.

FIG. 6 is a view showing the light emitting module 80 according to the third embodiment in a state before the optical wavelength conversion member 50 and the semiconductor light emitting element 62 are bonded to each other. In the third embodiment, first of all, the bonding buffer layer 82 is provided on the emission surface 66a of the semiconductor light emitting element 62.

The bonding buffer layer 82 is formed on the emission surface 66a of the crystal growth substrate 66 in the shape of a thin film by sputtering. Meanwhile, deposition, MOCVD (Metal Organic Chemical Vapor Deposition), or MBE (Molecular Beam Epitaxy) may be used instead of sputtering. The bonding buffer layer 82 has translucency for transmitting a portion of light that is emitted from the semiconductor layer 64.

Then, the bonding buffer layer 82 and the incident plane 50a of the optical wavelength conversion member 50 are directly bonded to each other without adhesive. According to experimental results, it has been confirmed that the bonding buffer layer and the incident plane of the optical wavelength conversion member can be directly bonded to each other by both surface activation bonding and plasma bonding. Meanwhile, it has been confirmed that the bonding buffer layer and the incident plane of the optical wavelength conversion member can be bonded to each other even though the material of the bonding buffer layer 82 may be YAG or $SiO_2$. Accordingly, even in this aspect, it may be possible to directly bond the semiconductor light emitting element 62 to the optical wavelength conversion member 50 without adhesive.

(Fourth Embodiment)

Figure 7:
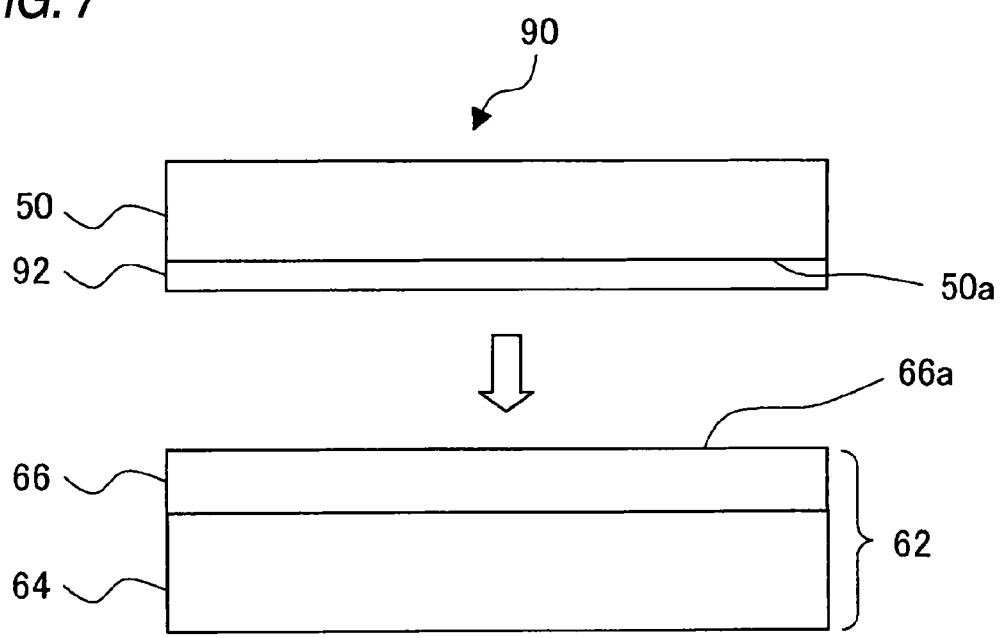
FIG. 7 is a view showing a light emitting module according to a fourth embodiment of the invention in a state before an optical wavelength conversion member and a semiconductor light emitting element are bonded to each other.

FIG. 7 is a view showing the light emitting module 90 according to a fourth embodiment of the invention in a state before an optical wavelength conversion member 50 and a semiconductor light emitting element 62 are bonded to each other. Meanwhile, the configuration of a vehicle headlamp 10 according to the fourth embodiment is substantially the same as that according to the first embodiment except that a light emitting module 90 is provided instead of the light emitting module 40. Hereinafter, the same components as those of the above-mentioned embodiment are denoted by the same reference numerals and the description thereof will be omitted herein.

First of all, a bonding buffer layer 92 is provided on the incident plane 50a of the optical wavelength conversion member 50. A method of forming the bonding buffer layer 92 is substantially the same as described above. Then, the bonding buffer layer 92 and the emission surface 66a of the crystal growth substrate 66 are directly bonded to each other without adhesive. According to experimental results, it has been confirmed that the bonding buffer layer and the light emitting surface of the crystal growth substrate can be directly bonded to each other by both surface activation bonding and plasma bonding. Meanwhile, it has been confirmed that the bonding buffer layer and the light emitting surface of the crystal growth substrate can be bonded to each other even though the material of the bonding buffer layer 92 may be YAG or $SiO_2$. Accordingly, even in this aspect, it may be possible to directly bond the semiconductor light emitting element 62 to the optical wavelength conversion member 50 without adhesive.

Meanwhile, the bonding buffer layer 82 may be formed on the incident plane 50a of the optical wavelength conversion member 50, and the bonding buffer layer 82 and the bonding buffer layer 92 may be directly bonded to each other. A method of forming the bonding buffer layer 82 is substantially the same as described above. Even when bonding buffer layers may be provided on both the optical wavelength conversion member 50 and the semiconductor light emitting element 62 as described above, it may be possible to appropriately bond the optical wavelength conversion member to the semiconductor light emitting element without adhesive.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

In a certain modification, a light emitting element, which mainly emits ultraviolet light, may be used as a semiconductor light emitting element. Further, an optical wavelength conversion member may be formed by stacking a plurality of optical wavelength conversion layers that converts the ultraviolet light into light having different colors. For example, an optical wavelength conversion member may be formed by stacking an optical wavelength conversion layer that converts ultraviolet light into blue light, and an optical wavelength conversion layer that converts ultraviolet light into yellow light. Alternatively, an optical wavelength conversion member may be formed by stacking an optical wavelength conversion layer that converts ultraviolet light into blue light, an optical wavelength conversion layer that converts ultraviolet light into green light, and an optical wavelength conversion layer that converts ultraviolet light into red light. It may also be possible to obtain a light emitting module, which emits white light, by forming the semiconductor light emitting element and the optical wavelength conversion member as described above.

Meanwhile, a plurality of fluorescent materials that convert ultraviolet light into light having different colors may be contained in the optical wavelength conversion member. For example, a fluorescent material that converts ultraviolet light into blue light, and a fluorescent material that converts ultraviolet light into yellow light may be contained in the optical wavelength conversion member. Alternatively, a fluorescent material that converts ultraviolet light into blue light, a fluorescent material that converts ultraviolet light into green light, and a fluorescent material that converts ultraviolet light into red light may be contained in the optical wavelength conversion member. It may also be possible to obtain a light emitting module, which emits white light, by forming the semiconductor light emitting element and the optical wavelength conversion member as described above.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A light emitting module comprising:
   a semiconductor light emitting element that emits light; and
   a plate optical wavelength conversion member that converts a wavelength of light emitted from the semiconductor light emitting element and emits light having the converted wavelength,
   wherein the semiconductor light emitting element and the optical wavelength conversion member are directly bonded to each other without adhesive, and
   wherein the plate optical wavelength conversion member is a plate fluorescent ceramic member and is transparent such that a total light transmittance of the light having the converted wavelength is 40% or more.

2. The light emitting module according to claim 1, wherein the semiconductor light emitting element comprises a semiconductor layer, and the semiconductor layer and the optical wavelength conversion member are directly bonded to each other without adhesive.

3. The light emitting module according to claim 2, wherein the semiconductor layer and the optical wavelength conversion member are directly bonded to each other by surface activation bonding.

4. The light emitting module according to claim 1, wherein the semiconductor light emitting element comprises:
   a semiconductor layer; and
   a crystal growth substrate that is used for a crystal growth of the semiconductor layer, and
   wherein the crystal growth substrate and the optical wavelength conversion member are directly bonded to each other without adhesive.

5. The light emitting module according to claim 1, wherein the semiconductor light emitting element comprises a bonding buffer layer, and
   wherein the bonding buffer layer and the optical wavelength conversion member are directly bonded to each other without adhesive.

6. The light emitting module according to claim 1,
wherein the optical wavelength conversion member comprises a bonding buffer layer, and
wherein the bonding buffer layer and the semiconductor light emitting element are directly bonded to each other without adhesive.

7. The light emitting module according to claim 6,
wherein the bonding buffer layer and the semiconductor light emitting element are directly bonded to each other by surface activation bonding.

8. The light emitting module according to claim 6,
wherein the bonding buffer layer and the semiconductor light emitting element are directly bonded to each other by plasma bonding.

9. The light emitting module according to claim 1,
wherein the semiconductor light emitting element is a vertical-chip element.

10. The light emitting module according to claim 1,
wherein the semiconductor light emitting element is a face-up element.

11. The light emitting module according to claim 1,
wherein the plate optical wavelength conversion member is obtained by sintering a ceramic base made of YAG (Yttrium Aluminum Garnet) powder.

12. The light emitting module according to claim 1,
wherein the plate optical wavelength conversion member is one of an amorphous member, a polycrystalline member and a single-crystalline member.

13. The light emitting module according to claim 1,
wherein the plate optical wavelength conversion member is made of an inorganic material without an organic binder,
wherein the optical wavelength conversion member improves durability.

14. The light emitting module according to claim 1,
wherein the semiconductor light emitting element and the optical wavelength conversion member are directly bonded to each other by surface activation bonding.

15. A method of manufacturing a light emitting module, the method comprising:
directly bonding a semiconductor light emitting element to a plate optical wavelength conversion member, which converts a wavelength of light emitted from the semiconductor light emitting element and emits a light having the converted wavelength, without adhesive,
wherein the plate optical wavelength conversion member is plate fluorescent ceramic member and is transparent such that a total light transmittance of the light having the converted wavelength is 40% or more.

16. The light emitting module substrate comprising,
a semiconductor light emitting element that emits light;
a plate optical wavelength conversion member that converts a wavelength of light emitted from the semiconductor light emitting element and emits light having the converted wavelength,
a substrate;
a submount; and
a color-less transparent cover,
wherein the semiconductor light emitting element and the optical wavelength conversion member are directly bonded to each other without adhesive forming a light emitting module,
wherein the plate optical wavelength conversion member is a plate fluorescent ceramic member and is transparent such that a total light transmittance of the light having the converted wavelength is 40% or more, and
wherein the light emitting module and the submount are disposed between the color-less transparent cover and the substrate.

17. The light emitting module substrate according to claim 16,
wherein the light emitting module is mounted on the submount and the submount is mounted on the substrate.

* * * * *